United States Patent
Maeda et al.

(10) Patent No.: US 6,930,327 B2
(45) Date of Patent: Aug. 16, 2005

(54) SOLID-STATE IMAGING DEVICE AND METHOD OF MANUFACTURING THE SAME

(75) Inventors: Hiroshi Maeda, Kanagawa (JP); Kazuhiro Nishida, Kanagawa (JP); Yoshihisa Negishi, Kanagawa (JP); Shunichi Hosaka, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/601,567

(22) Filed: Jun. 24, 2003

(65) Prior Publication Data

US 2004/0075761 A1 Apr. 22, 2004

(30) Foreign Application Priority Data

Jun. 24, 2002 (JP) .................................... P2002-183073
Jun. 19, 2003 (JP) .................................... P2003-175163

(51) Int. Cl.[7] ................ H01L 29/04; H01L 31/036; H01L 31/0376; H01L 31/20
(52) U.S. Cl. .................. 257/59; 257/72; 257/89; 257/434; 257/460; 257/462; 438/73; 438/75
(58) Field of Search ................. 257/59, 72, 89, 257/434, 460, 462; 438/73, 75

(56) References Cited

U.S. PATENT DOCUMENTS

| | | | |
|---|---|---|---|
| 3,765,747 A | * 10/1973 | Pankratz et al. | ............ 349/160 |
| 4,149,197 A | * 4/1979 | Kos et al. | ............ 358/471 |
| 5,634,835 A | * 6/1997 | Wu et al. | ............ 445/24 |
| 5,827,755 A | * 10/1998 | Yonehara et al. | ............ 438/30 |
| 6,218,784 B1 | * 4/2001 | Jang et al. | ............ 315/169.1 |
| 6,611,013 B2 | * 8/2003 | Rhodes | ............ 257/292 |
| 6,690,344 B1 | * 2/2004 | Takeuchi et al. | ............ 345/85 |
| 6,784,612 B2 | * 8/2004 | Park et al. | ............ 313/512 |
| 2002/0019069 A1 | * 2/2002 | Wada | ............ 438/69 |
| 2002/0140836 A1 | * 10/2002 | Miyake et al. | ............ 348/340 |

FOREIGN PATENT DOCUMENTS

| | | | | |
|---|---|---|---|---|
| JP | 7-202152 A | 8/1995 | | |
| JP | 8-5566 U | 2/1996 | | |
| JP | 2001-351997 A | 12/2001 | | |
| JP | 2002-198463 A | 7/2002 | | |
| JP | 2002-231918 A | 8/2002 | | |
| JP | 2002-231919 A | 8/2002 | | |
| JP | 2002-231921 A | 8/2002 | | |
| JP | 2002-260842 A | 9/2002 | | |
| JP | 2002270122 A | * 9/2002 | ............ | H01J/31/28 |
| JP | 2002-329850 A | 11/2002 | | |
| JP | 2002329850 A | * 11/2002 | ............ | H01L/27/14 |
| JP | 2002-351997 A | 12/2002 | | |
| JP | 2003-116066 A | 4/2003 | | |

* cited by examiner

*Primary Examiner*—Amir Zarabian
*Assistant Examiner*—Ida M. Soward
(74) *Attorney, Agent, or Firm*—Birch, Stewart, Kolasch & Birch, LLP

(57) ABSTRACT

There are provided a semiconductor substrate 101 on which solid-state imaging devices are formed, and a translucent member 201 provided onto a surface of the semiconductor substrate such that spaces are provided to oppose light receiving areas of the solid-state imaging devices, wherein external connecting terminals are arranged on an opposing surface of the semiconductor substrate 101 to a solid-state imaging device forming surface, and the external connecting terminals are connected to the solid-state imaging devices via through-holes provided in the semiconductor substrate 101.

9 Claims, 8 Drawing Sheets

SOLID-STATE IMAGING DEVICE AND METHOD OF MANUFACTURING THE SAME

This nonprovisional application claims priority under 35 U.S.C. § 119(a) on Patent Application No(s). 2002-183073 filed in JAPAN on Jun. 24, 2002 and 2003-175163 filed in JAPAN on Jun. 19, 2003, which is(are) herein incorporated by reference.

BACKGROUND OF THE INVENTION

1. Field of the Invention

The present invention relates to a solid-state imaging device and a method of manufacturing the same and, more particularly, a solid-state imaging device of the chip size package (CSP) type in which a micro lens is formed integrally on a chip.

2. Description of the Related Art

Because of the request for the application to the cellular phone, the digital camera, etc., the demand for the reduction in size of the solid-state imaging device including CCD (Charge Coupled Device) is increased.

As one measure for such demand, the solid-state imaging devices in which the micro lens is provided in the light receiving area of the semiconductor chip have been proposed. For instance, there has been proposed the solid-state imaging device, for example, that intends to reduce a size by packaging integrally the solid-state imaging devices, in which the micro lens is provided in the light receiving area, to have the hermetic sealed portion between the light receiving area and the micro lens of the solid-state imaging device (JP-A-7-202152).

According to such configuration, reduction in the packaging area can be achieved, and also optical parts such as the filter, the lens, the prism, etc. can be bonded onto a surface of the hermetic sealed portion. Thus, reduction in the packaging size can be achieved not to bring about reduction in the converging ability of the micro lens.

However, upon packaging such solid-state imaging device, in order to pick up the signal to the outside, the solid-state imaging device must be mounted onto the supporting substrate onto which such imaging device is packaged, then the electrical connection must be applied by the method such as the bonding, or the like, and then the sealing must be applied. In this manner, there is such a problem that, since a large number of steps (man-hours) are required, a lot of time is needed to package.

Also, if it is tried to form the external connection terminals on the solid-state imaging device substrate, restrictions are put on many areas because of optical connection, mechanical connection, and electrical connection. As a result, it is difficult to reduce the size of the solid-state imaging device.

SUMMARY OF THE INVENTION

The present invention has been made in view of the above circumstances, and it is an object of the present invention to provide a method of manufacturing a solid-state imaging device that is easy to manufacture and has high reliability. Also, it is another object of the present invention to provide a solid-state imaging device a size of which is small and which is easily connected to a main body.

Therefore, according to the present invention, a solid-state imaging device comprises a semiconductor substrate on which solid-state imaging devices are formed; a translucent member provided onto a surface of the semiconductor substrate such that spaces are provided to be opposed to light receiving areas of the solid-state imaging devices, and a through-hole which are formed in the semiconductor substrate, wherein said solid-state imaging device is electrically connected to an external contact terminal by way of said through-hole.

According to such configuration, the signal leading and the current supply can be executed on the back surface side of the solid-state imaging device side that does not contribute to receive the light. Therefore, the packaging can be made easy and the assembling into the device can be facilitated, and reduction in size can be achieved as the overall device. Also, since the translucent member is connected to the semiconductor substrate such that the spaces are provided to oppose to the light receiving areas of the solid-state imaging devices, the solid-state imaging device that is small in size and has the good light converging property can be provided.

In this invention, said external contact terminal is formed on a surface of the semiconductor substrate, said surface being opposed to another surface thereof where the solid-state imaging element is formed.

In this invention, said solid-state imaging device further comprising a reinforcing plate which is contacted at a surface side of the semiconductor substrate, said surface side being opposed to another surface of the semiconductor substrate where the solid-state imaging element is formed, wherein said external contact terminal is arranged at a surface of the reinforcing plate, said surface being opposed to another surface of the reinforcing plate where contact between the semiconductor substrate and the reinforcing plate is made.

Preferably, the translucent member of the solid-state imaging device is connected to the semiconductor substrate via spacers. Therefore, the dimensional precision of the spaces can be improved, and the solid-state imaging device with good optical characteristic can be obtained at a low cost.

Preferably, in this invention, the spacers are formed of same material as the translucent member. Therefore, generation of the distortion due to difference in thermal expansion coefficients between the translucent member and the spacers in response to the temperature change can be prevented, and thus the longer life can be achieved.

Preferably, in this invention, the spacers are formed of same material as the semiconductor substrate. Therefore, generation of the distortion due to difference in thermal expansion coefficients between the semiconductor substrate and the spacers in response to the temperature change can be prevented, and thus the longer life can be achieved.

Preferably, in this invention, the spacers are formed of resin material. In this case, the resin material may be filled between the solid-state imaging device substrate and the translucent member, or may be constructed by the sheet-like resin material. If the spacers are formed by filling the resin material between the translucent member and the semiconductor substrate, the stress can be absorbed by the elasticity. Therefore, generation of the distortion due to difference in thermal expansion coefficients between the translucent member and the spacers in response to the temperature change can be prevented, and thus the longer life can be achieved.

Further, in this invention, the spacers are formed of 42 alloy or silicon. Therefore, the production cost becomes lowered, and generation of the distortion due to difference in thermal expansion coefficients between the semiconductor substrate and the spacers in response to the temperature change can be prevented, and thus the longer life can be achieved. Also, the material is not limited to the 42 alloy, and other metal, ceramic, inorganic material, or the like may be employed.

In this invention, said through-hole is filled with a conductive material in an inner wall thereof with an insulating film being formed in-between.

In this invention, said insulating film is made of silicon oxide.

In this invention, thickness of said insulating film is no less than 0.5 µm.

Having these structures, insulation can be secured with element forming regions.

Also, according to the present invention, a solid-state imaging device manufacturing method, comprises the steps of forming a semiconductor substrate on a surface of which a plurality of solid-state imaging devices are arranged and on a back surface side of which external connecting terminals are arranged such that the external connecting terminals are connected electrically to the solid-state imaging devices via through-holes; jointing a translucent member to a surface of the semiconductor substrate such that spaces are provided to oppose to light receiving areas of the solid-state imaging devices; and separating a jointed body obtained in jointing step into individual solid-state imaging devices.

According to such configuration, the semiconductor substrate, on a surface of which a plurality of solid-state imaging devices are arranged and on a back surface side of which external connecting terminals are arranged such that the external connecting terminals are connected electrically to the solid-state imaging devices via through-holes, is formed. Therefore, the solid-state imaging devices are positioned at the wafer level at a predetermined interval from the translucent member, then these imaging devices including the external leading electrode terminals are packaged collectively and integrally, and the wafer is separated every solid-state imaging device. As a result, the solid-state imaging device that is easy to manufacture with the high reliability can be achieved.

Preferably, the step of jointing the translucent member includes the steps of preparing a translucent member having a plurality of concave portions at positions that correspond to solid-state imaging device forming regions, and jointing the translucent member to a surface of the semiconductor substrate.

According to such configuration, the concave portions can be formed easily only by forming previously the concave portions in the translucent substrate such that the spaces are provided to oppose to respective light receiving areas. Therefore, the number of parts can be reduced and the manufacturing is made easy.

Preferably, the solid-state imaging device manufacturing method further comprises, prior to the step of jointing, the step of forming projected portions on a surface of the semiconductor substrate to surround the light receiving areas; wherein spaces are formed between the light receiving areas and the translucent member by the projected portions.

According to such configuration, the solid-state imaging device that has the good workability and the high reliability can be provided easily only by packaging the solid-state imaging device onto the substrate to put the projected portions (spacers) that are formed previously on the surface of the semiconductor substrate therebetween.

Preferably, the step of jointing is executed to form spaces between the semiconductor substrate and the translucent member via spacers that are arranged to surround the light receiving areas.

According to such configuration, the solid-state imaging device that has the high reliability can be provided easily merely by putting the spacers therebetween.

In this invention, said method is further comprising the steps of: a step of forming solid-state imaging elements on a surface of the semiconductor substrate; a step of forming through-holes at a surface of the semiconductor substrate; a step of forming an insulating film in inner walls of the through-holes, and a step of filling conductive material in the through-holes.

In this invention, the step of forming the insulating film includes a cold CVD method.

In this invention, the step of filling conductive material includes a vacuum screen-printing method.

Having these structures, the conductive material can be filled with through-holes while a negative pressure is produced therein by vacuum pumping, and contact between the conductive material and the solid-state imaging element can be secured easily without generation of voids.

DESCRIPTION OF THE PREFERRED EMBODIMENTS

Embodiments of the present invention will be explained with reference to the drawings hereinafter.

(First Embodiment)

Figure 1:
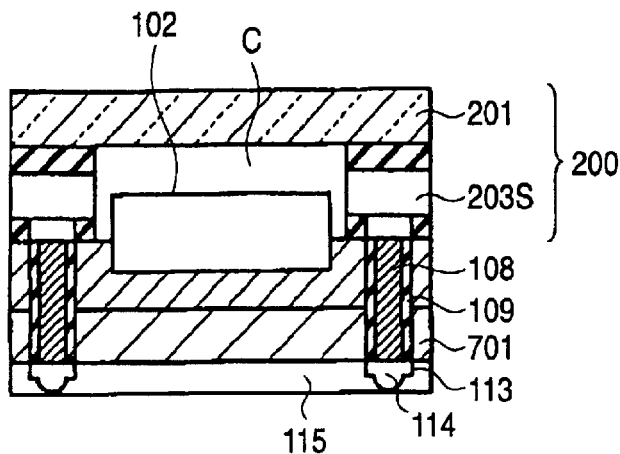
FIGS. 1(a) and (b) are a sectional view and an enlarged fragmental sectional view showing a solid-state imaging device of a first embodiment of the present invention respectively.
Figure 1:
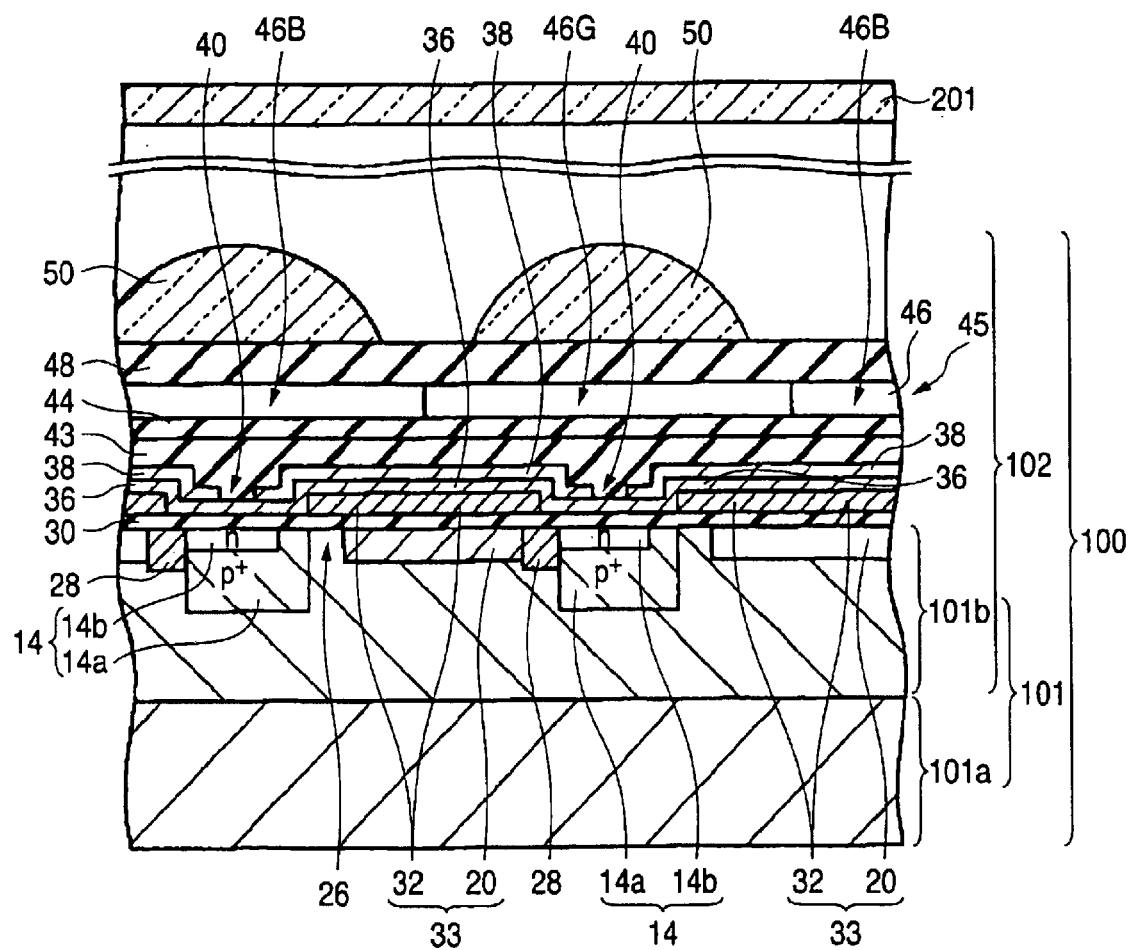

In this solid-state imaging device, as shown in a sectional view of FIG. 1(a) and an enlarged fragmental sectional view of a solid-state imaging device substrate of FIG. 1(b), a glass substrate 201 serving as a translucent member is bonded onto a surface of a solid-state imaging device substrate 100 made of a silicon substrate 101 serving as a semiconductor substrate, in which a solid-state imaging element 102 is formed, via a spacer 203S in such a manner that a space C can be provided to be functioning as a light receiving area of the solid-state imaging device substrate 100. Further, a support member 701 is formed at the opposite side of the solid-state imaging element being formed on the solid-state imaging device substrate 100. The support member 701 is electrically connected to pads 113 and bumps 114 as external leading terminals via through-holes H being formed on the solid-state imaging device substrate 100 in such a way that said pads 113 and bumps 114 are arranged at the opposite side of the semiconductor substrate. through-hole Then, after mounting this solid-state imaging device with wafer level, connections to the outside can be made via the bumps 114 by separating individually peripheries by using a dicing method. Here, as shown in FIG. 4(d), a conductive layer 108 is formed in the through-hole H, and the bumps 114 are connected to a peripheral circuit substrate 901 via an anisotropic conductive film 115. In this case, a height of the spacer 203S is set in a range from 10 to 500 μm, preferably between 80 and 120 μm.

Here, as shown in the enlarged fragmental sectional view of FIG. 1(b), the solid-state imaging device substrate 100 is constructed by the silicon substrate 101, on a surface of which solid-state imaging elements are arranged and RGB color filters 46 and micro lenses 50 are formed. Here, though not appear in this cross section, through-holes are formed such that they are connected to charge transfer electrodes 32.

The solid-state imaging device substrate 100 is constructed by forming a channel stopper 28 in a p-well 101b formed on a surface of an n-type silicon substrate 101a and then forming a photodiode 14 and a charge transfer device 33 to put this channel stopper therebetween. In this case, the photodiode 14 is constructed by forming an n-type impurity region 14b in a p⁺-channel region 14a. Also, the charge transfer element 33 is constructed by forming a vertical charge transfer channel 20 made of an n-type impurity region, which is formed to have a depth of about 0.3 μm, in the p⁺-channel region 14a and also forming a vertical charge transfer electrode 32 made of a polysilicon layer, which is formed over an upper layer of this channel via a gate insulating film 30 made of a silicon oxide film. Also, a reading gate channel 26 made of a p-type impurity region is formed between the charge transfer element 33 and the photodiode 14 that is used to read a signal charge to this vertical charge transfer channel 20. A through-hole (not shown in FIG. 1(b)) is formed to be connected to the vertical charge transfer electrode 32.

The n-type impurity region 14b is exposed from the surface of the silicon substrate 101 along this reading gate channel 26. The signal charge generated by the photodiode 14 is accumulated temporarily in the n-type impurity region 14b and then read out via the reading gate channel 26.

In contrast, the channel stopper 28 made of the p⁺-type impurity region is present between the vertical charge transfer channel 20 and other photodiode 14. Thus, the photodiode 14 and the vertical charge transfer channel 20 are isolated electrically from each other, and also the vertical charge transfer channels 20 are separated not to come into contact with each other.

Then, the vertical charge transfer electrode 32 is formed to cover the reading gate channel 26 and to expose the n-type impurity region 14b and a part of the channel stopper 28. In this case, the signal charge is transferred from the reading gate channel 26 that is located under a portion, to which the reading signal is applied, of the vertical charge transfer electrode 32.

Then, the vertical charge transfer electrode 32 and the vertical charge transfer channels 20 constitute the vertical charge transfer device (VCCD) 33 that transfers the signal charge, which is generated by pn junction of the photodiode 14, in the vertical direction. A surface of the substrate on which the vertical charge transfer electrode 32 is formed is covered with a surface protection film 36. Then, a light shielding film 38 made of tungsten is formed on an upper layer of this film such that only a light receiving area 40 of the photodiode 14 is opened but other areas are shielded from the light.

Then, an upper surface of the vertical charge transfer electrode 32 is covered with a planarizing insulating film 43, which is formed to planarize the surface of the electrode, and a translucent resin film 44, which is formed on an upper surface of this film 43. Then, a filter layer 46 is formed on an upper surface of this film 44. A red-color filter layer 46R, a green-color filter layer 46G, and a blue-color filter layer 46B are arranged sequentially in the filter layer 46 such that predetermined patterns are formed to respond to respective photodiodes 14.

Then, an upper surface of the filter layer 46 is covered with a micro lens array consisting of micro lenses 50 via a planarizing insulating film 48. These micro lenses 50 are formed by patterning the translucent resin containing the photosensitive resin with the refractive index of 1.3 to 2.0 by virtue of the photolithography, then melting the resin to round such resin by a surface tension, and then cooling the rounded resins.

Next, steps of manufacturing the solid-state imaging device will be explained hereunder. As shown in manufacturing steps of FIGS. 2(a) to (d) and FIGS. 3(a) to (c), this method is executed based on the so-called wafer-level CSP method, in which the solid-state imaging devices are positioned at a wafer level, then these imaging devices are packaged collectively and integrally, and the wafer is separated every solid-state imaging device. (Although only two units are depicted on Figures hereinafter, a large number of solid-state imaging devices are formed successively on the wafer.) This method is characterized in that edges of the solid-state imaging device substrate 100 and the glass substrate 201 are formed on an identical surface, and also the external leading terminals are led to the back surface side via through-holes that pass through the solid-state imaging device substrate 100 and a reinforcing plate 701 that is pasted onto a back surface of this substrate. Here, a sealing cover glass 200 with a spacer, in which the spacer 203S is formed previously, is employed.

First, formation of the glass substrate with the spacer will be explained hereunder.

Figure 2:
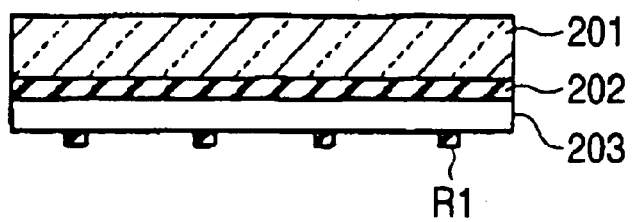
FIGS. 2(a) to (d) are views showing steps of manufacturing the solid-state imaging device of the first embodiment of the present invention.
Figure 2:
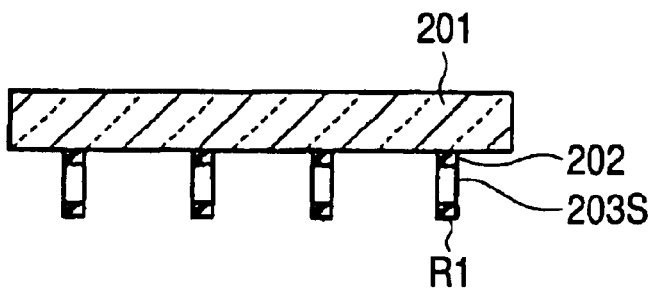
Figure 2:
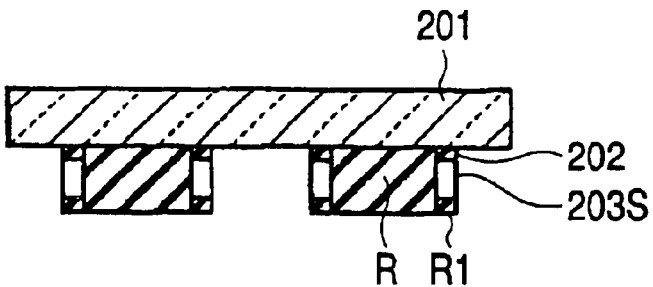
Figure 2:
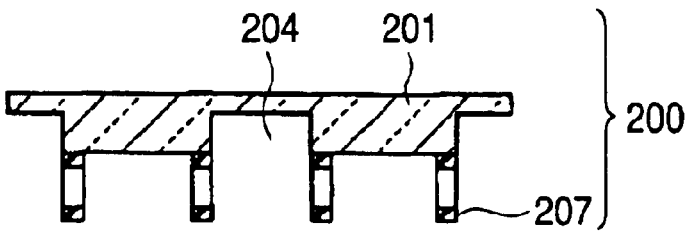

As shown in FIG. 2(a), a silicon substrate 203 serving as the spacer is adhered onto a surface of the glass substrate 201 via an adhesive layer 202 made of ultraviolet curing adhesive (cationic polymerization energy-line curing adhesive). Then, a resist pattern R1 is left at portions, at which the spacers are formed, by the etching method using the photolithography.

Then, as shown in FIG. 2(b), the spacers 203S are formed by etching the silicon substrate 203 while using this resist pattern R1 as a mask.

Then, as shown in FIG. 2(c), while leaving the resist pattern R1 to form the spacers 203S, resist is filled in inter-spacer areas except inter-element areas. Then, as shown in FIG. 2(d), inter-element recess portions 204 are formed by etching the glass substrate 201 up to a predetermined depth. Then, an adhesive layer 207 is formed on surfaces of the spacers respectively. In this case, the spacers are formed of the silicon substrate. Therefore, if the etching is carried out under the conditions that an etching rate of silicon oxide as a major component of the glass substrate 201 can be set sufficiently largely rather than an etching rate of silicon, such etching may be carried out in the situation that side walls of the spacers are exposed in the inter-element areas. The dicing blade (grindstone) may be employed to form the inter-element recess portions 204.

Also, the recess portions 204 may be formed by forming the resist pattern R, which includes the overall side walls of the spacers, by applying the photolithography again, and then executing the etching via this resist pattern. In this manner, the sealing cover glass 200 in which the recess portions 204 and the spacers 203S are formed is obtained.

Figure 3:
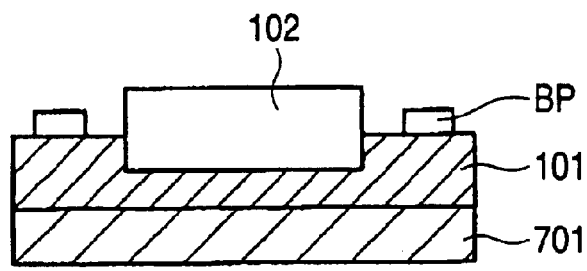
FIGS. 3(a) to (c) are views showing steps of manufacturing the solid-state imaging device of the first embodiment of the present invention.
Figure 3:
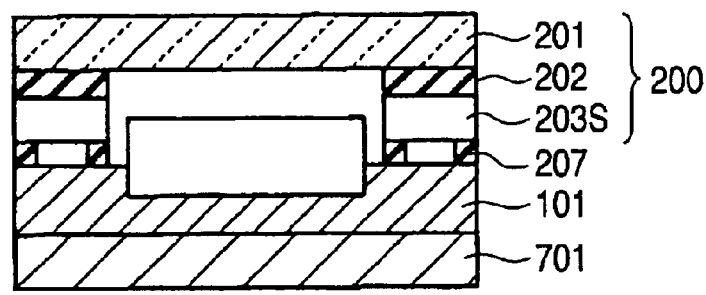
Figure 3:
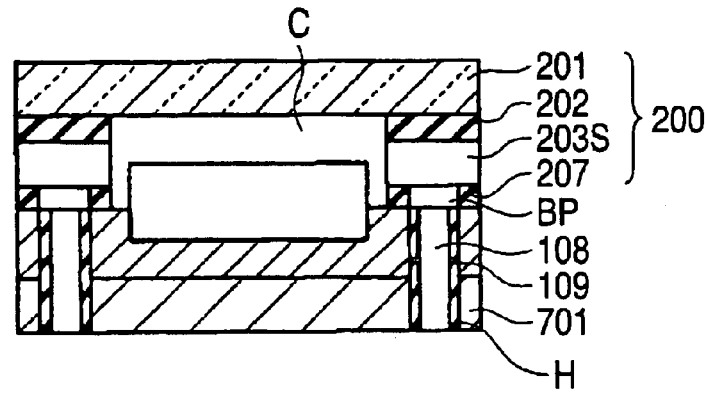

Then, the solid-state imaging device substrate 100 is formed. As shown in FIG. 3(a), the silicon substrate 101 is prepared previously (here a 4–8 inch wafer is used) to form the solid-state imaging device substrate 100. (Although only one unit is depicted in Figures hereinafter, a large number of solid-state imaging devices are formed successively on the wafer) Then, the device region including the channel stopper layer, the channel region, the charge transfer electrode, etc. are formed by using the ordinary silicon processes (FIG. 3(a)). Then, the reinforcing plate 701 made of the silicon substrate, on which a silicon oxide film is formed, is jointed onto a back surface of the solid-state imaging device substrate 100 by the surface-activated cold joint.

Then, as shown in FIG. 3(b), alignment is executed by using alignment marks that are formed on peripheral portions of respective substrates. Then, the sealing cover glass 200 in which the spacers 203S are adhered to the plate-like glass substrate 201 is mounted on the solid-state imaging device substrate 100 formed as above. Then, a resultant structure is heated to joint integrally both the cover glass and the device substrate by the adhesive layer 207. It is desired that this step should be executed in vacuum or in an inert gas atmosphere such as a nitrogen gas.

Then, the through-holes 108 are formed from the back surface side of the reinforcing plate 701 by anisotropic etching with using resist pattern mask that is formed by the photolithography. Then, a silicon oxide film 109 is formed in the through-hole H by the CVD method. Then, the silicon oxide film 109 is left only on side walls of the through-holes H by applying the anisotropic etching (FIG. 3(c)). Since this film forming process is performed under low pressure, the silicon oxide film 109 can be well coated in the through-hole H. More specifically, said anisotropic etching is performed so that the silicon oxide film 109 remains only on the inner wall of the through-hole H which allows the pad BP to be exposed. As a result, silicon oxide film 109 having around 5μ can be formed at the inner wall of the through-hole.

Then, as shown in FIG. 4(a), silver film is formed as a conductor layer 108, which contacts to the bonding pad, in the through-hole H by the screen-printing method using silver paste from back surface under vacuum condition. It is also possible to form such a conductive layer by using alternative methods, such as forming tungsten film by using CVD method with $WF_6$ gas, instead of using the screen-printing method.

Then, as shown in FIG. 4(b), the bonding pads 113 are formed on a surface of the reinforcing plate 701, and then the bumps 114 are formed.

In this manner, signal leading electrode terminals and current-supplying electrode terminals can be formed on the reinforcing plate 701 side.

Then, as shown in FIG. 4(c), the anisotropic conductive film 115 (ACP) is coated on the surface of the reinforcing plate 701.

Lastly, as shown in FIG. 4(d), the circuit substrate 901 on which driving circuits are formed is connected via the anisotropic conductive film 115. In this case, made of the conductive layer, which is filled in the through-holes formed to pass through the substrate, and bonding pads 210 are formed in this circuit substrate 901. The connection to the circuit substrate 901 may be executed by the jointing using the ultrasonic wave, the soldering, the eutectic bonding, or the like.

Accordingly, the connection to the circuit substrate such as the printed board, or the like can be attained easily via the bonding pads 210.

Then, the dicing is applied to the overall wafer along the dicing line DC that contains the contact layers 117 and the conductive layers 108 in its inside. Thus, the wafer is divided into individual solid-state imaging devices. (Although only one unit is depicted in Figures, a large number of solid-state imaging devices are formed successively on one sheet of the wafer.)

In this manner, the solid-state imaging devices can be manufactured extremely easily with good workability.

In this case, the reinforcing plate 701 is formed of the silicon substrate on which the silicon oxide film is formed. Therefore, the thermal insulation or the electric insulation between the solid-state imaging device substrate 100 and the reinforcing plate 701 can be provided.

Also, in the previous embodiment, the conductive layer is formed in the through-holes H by the screen-printing method. In this case, even if the plating method, the CVD method, the vacuum suction method, or the like is employed, the filling of the conductive layer into the contact holes, which have a high aspect ratio, can be executed easily with good workability.

Further, in the first embodiment, the electrical connection between the solid-state imaging device substrate 100 and the circuit substrate 901, on which the peripheral circuits are mounted, is provided via the through-holes. But the present invention is not limited to this process. There may be applied the method of forming contacts by the impurity diffusion applied from both the front surface and the back surface such that the front and back surfaces can be connected electrically, etc.

In this manner, the signal leading electrode terminals and the current-supplying electrode terminals can be formed can be formed on the reinforcing plate 701 side.

Furthermore, the solid-state imaging devices are packaged coactively not to execute the alignment individually and apply the electric connection such as the bonding individually, and then are separated into individual solid-state imaging devices. Therefore, the manufacturing is made easy and the handling is simplified.

Also, the recess portions 204 are formed previously on the glass substrate 201, and then remaining portions of the glass substrate 201 are removed from the surface by the CMP method, or the like up to a depth that reaches the recess portions 204 after the packaging is completed. Therefore, the solid-state imaging devices can be separated very easily.

Also, individual solid-state imaging devices can be formed only by applying the cutting or the polishing in the situation that the surface on which the device is formed is sealed in the clearance C by the jointing step. Therefore, the solid-state imaging device with high reliability can be provided with less damage to the device and without the entering of the dust.

Besides, since the silicon substrate 101 is thinned up to about ½ of the depth by the CMP, reduction in size and thickness of the solid-state imaging device can be achieved. Also, since the silicon substrate 101 is thinned after the silicon substrate 101 is jointed to the glass substrate 201, reduction in the mechanical strength can be prevented.

In this manner, according to the configuration of the present invention, the solid-state imaging devices are positioned at the wafer level, then these imaging devices are packaged collectively and integrally, and the wafer is separated every solid-state imaging device. As a result, the solid-state imaging device that is easy to manufacture with high reliability can be formed.

In this case, in the first embodiment, the solid-state imaging device is formed in such a manner that these imaging devices are connected collectively by the wafer-level CSP and then separated by the dicing. But the solid-state imaging device substrate 100, in which the through-holes H are formed and the bumps 114 are formed, is separated into individual solid-state imaging devices by the dicing, and then the sealing cover glass 200 may be adhered to the solid-state imaging device one by one.

Also, the micro lens array may be formed by forming a transparent resin film on the substrate surface, and then forming a lens layer in which a gradient of the refractive index is formed at a predetermined depth by the ion implantation from this surface.

Also, as the spacer, the glass, the polycarbnate, or the like may be selected appropriately in addition to the silicon substrate.

(Second Embodiment)

Next, a second embodiment of the present invention will be explained hereunder.

In the above first embodiment, the through-holes H are formed to pass through the reinforcing plate 701, and then the conductive layers 108 are formed. In this second embodiment, the solid-state imaging device substrate is formed by using the silicon substrate in which through-holes (vertical holes) are formed previously. Accordingly, because a depth of the vertical hole can be formed shallow, the productivity can be improved and also yield of the manufacturing can be improved.

Figure 5:
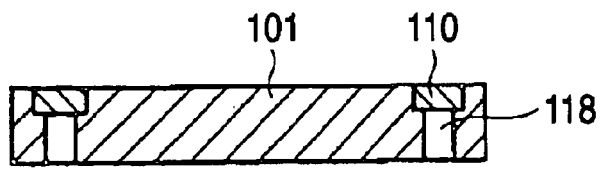
FIGS. 5(a) to (e) are views showing steps of manufacturing the solid-state imaging device of a second embodiment of the present invention.
Figure 5:
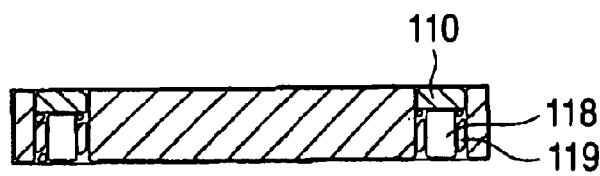
Figure 5:
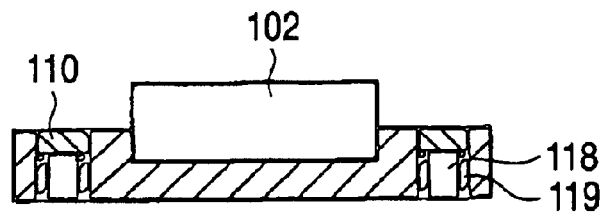
Figure 5:
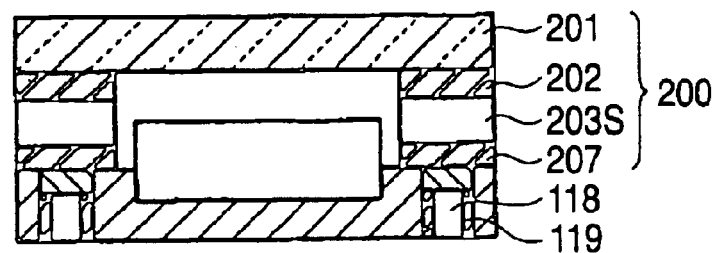
Figure 5:
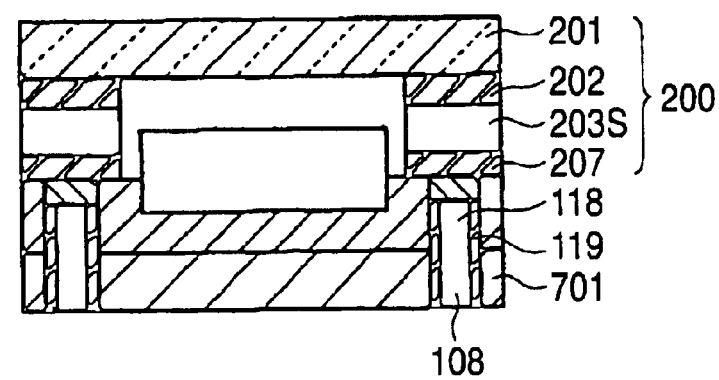

More particularly, as shown in FIG. 5(*a*), prior to the formation of the solid-state imaging element, first a resist pattern is formed on the back surface of the silicon substrate by the photolithography, and then through-holes H are formed by the RIE (Reactive Ion Etching) while using this resist pattern as a mask. In this case, in this step, a pad 110 made of aluminum, or the like is formed on the surface and then the through-holes H are formed to reach this pad.

Then, as shown in FIG. 5(*b*), a silicon oxide film 119 is formed on the inner wall of the through-hole H by the low-temperature CVD method.

Since this film forming process is performed under low pressure, the silicon oxide film 109 can be well coated in the through-hole H. More specifically, said anisotropic etching is performed so that the silicon oxide film 109 remains only on the inner wall of the through-hole H which allows the pad BP to be exposed.

It is also to adopt the alternative way, such as thermal oxidation method, instead of the low-temperature CVD method. However in this case, it is required for the back surface and substrate surface to be coated with the resist before hand.

Then, as shown in FIG. 5(*c*), like the above embodiment, element regions in which the solid-state imaging elements are formed by using the ordinary silicon processes.

Then, as shown in FIG. 5(*d*), the alignment is executed by using the alignment marks that are formed on peripheral portions of respective substrates. Then, the sealing cover glass 200, in which the spacers 203S are adhered to the plate-like glass substrate 201, is mounted on the solid-state imaging device substrate 100 formed as above. Then, a resultant structure is heated to joint integrally both the cover glass and the device substrate by the adhesive layer 207. In this case, the surface-activated cold joint may be employed as the jointing step.

Then, as shown in FIG. 5(*e*), the reinforcing plate 701 is jointed to the back surface side of the solid-state imaging device substrate 100 by the surface-activated cold joint, and then the through-holes 108 are formed from the back surface side by the etching method using the photolithography to come up to the through-holes 118 that was already made. Here, it is desired that the electric insulation should be applied to inner walls of the through-holes 108. Also, the reinforcing plate in which the through-holes are formed in advance may be employed.

Figure 4:
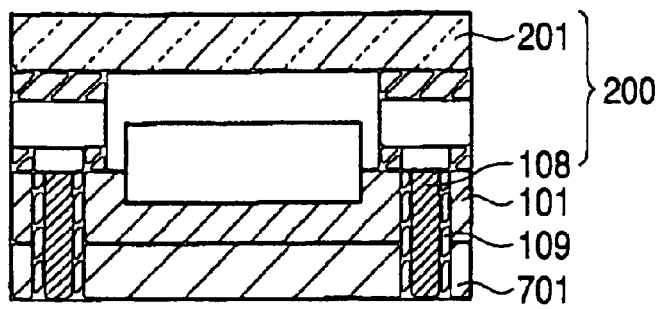
FIGS. 4(a) to (d) are views showing steps of manufacturing the solid-state imaging device of the first embodiment of the present invention.
Figure 4:
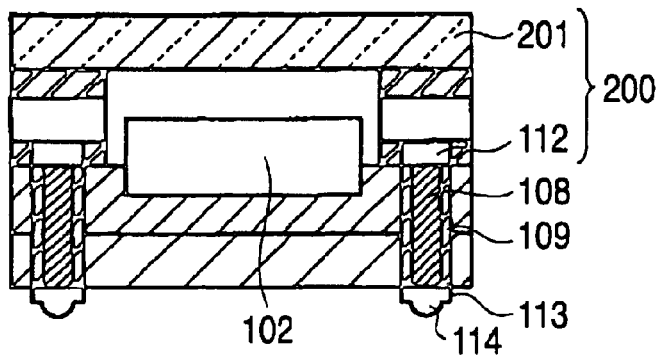
Figure 4:
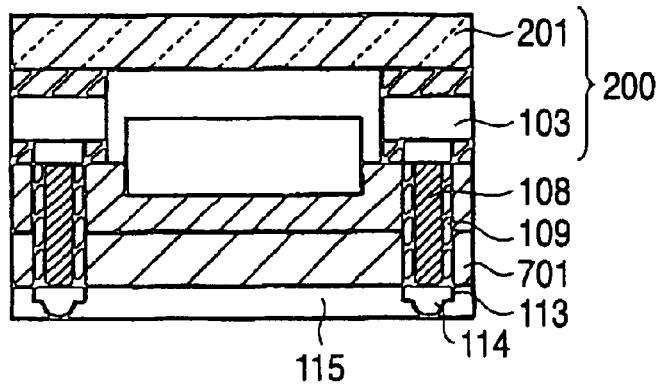
Figure 4:
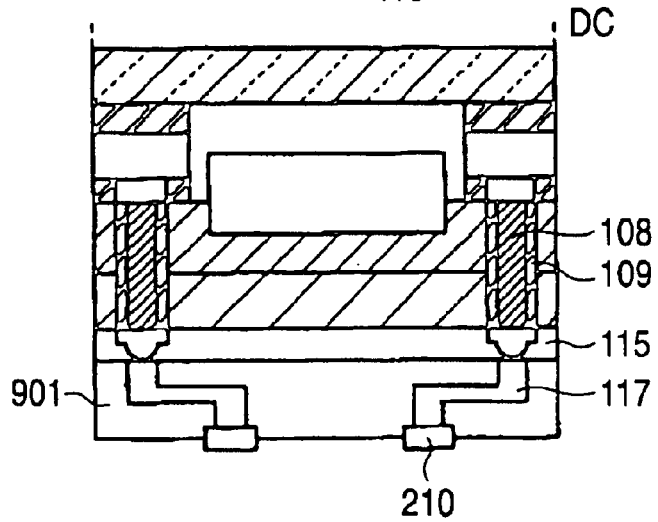

After this, the solid-state imaging device having the structure in which respective layers up to the circuit substrate on which the peripheral circuits are formed are laminated can be formed easily by executing the steps explained in the above first embodiment and shown in FIGS. 4(*a*) to (*d*). As described above, in the present embodiment, because the depth of the through-hole can be formed shallow, by which the productivity can be improved and also yield of the manufacturing can be improved.

(Third Embodiment)

Next, a third embodiment of the present invention will be explained hereunder.

In the above second embodiment, the conductivity layer in the through-hole H, which is formed in the solid-state imaging device substrate, can be formed after contact of the reinforcing plate 701 is made and another through-hole is formed in it. However, in the third embodiment, as the next step of forming the through-hole H, silver film for making contact with the bonding pad is formed by the screen-printing method under vacuum condition prior to the contact of the reinforcing plate 701 being made as shown in FIG. 6(*b*).

Figure 6:
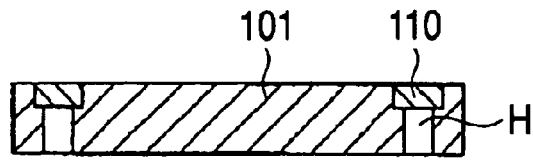
FIGS. 6(a) to (e) are views showing steps of manufacturing the solid-state imaging device of a third embodiment of the present invention.
Figure 6:
Figure 6:
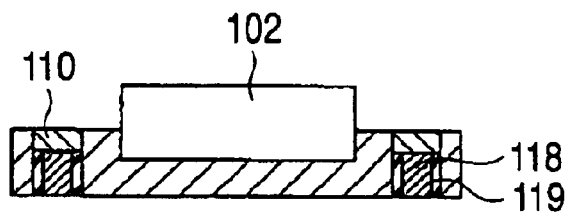
Figure 6:
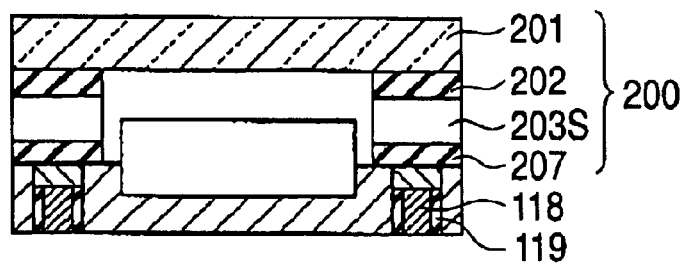
Figure 6:
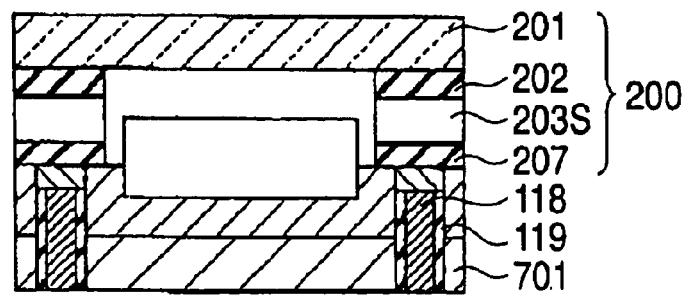

That is to say, the through-hole H is formed in the same way as shown in the second embodiment, and as shown in FIG. 6(*b*), the screen-printing is performed in such a way that silver paste is applied to the through-hole from the back surface by suction force generated by the vacuum screen-printing method, by which contact can be made between the silver film and the bonding pad in the through-hole.

The rests of the forming processes can be the same as that of the second embodiment. Namely, as shown in FIG. 6(*c*), like the previous embodiment, element regions in which the solid-state imaging elements are formed by using the ordinary silicon processes. Then, as shown in FIG. 6(*d*), after the alignment being made, the sealing cover glass 200, in which the spacers 203S are adhered to the plate-like glass substrate 201, is mounted on the solid-state imaging device substrate 100 formed as above. Then, a resultant structure is heated to joint integrally both the cover glass and the device substrate by the adhesive layer 207.

Then, as shown in FIG. 6(*e*), the reinforcing plate 701 is jointed to the back surface side of the solid-state imaging device substrate 100 by the surface-activated cold joint, and after another through-hole H being formed from the back surface, the vacuum screen-printing method is once more applied to the through-hole to form a conductive layer in it.

According to this structure, productivity might be lowered a little from the need of two processes because forming the conductive layer are twice performed separately for the formerly formed through-hole and the later formed through-hole. However, this requirement of duplicated processes gives also such a advantage that depth of each through-hole in which conductive layer is formed becomes shallow so that well coating condition can be expected.

Although the through-hole of the solid-state imaging element is formed prior to forming of the element region thereof in the above embedment, it is also possible to form a through-hole after the formation of the element region.

Further, the silver was used as material to form the conductive layer in the through-hole, however, any other conductive material can be adopted such as copper and so on.

(Fourth Embodiment)

Next, a fourth embodiment of the present invention will be explained hereunder.

Figure 7:
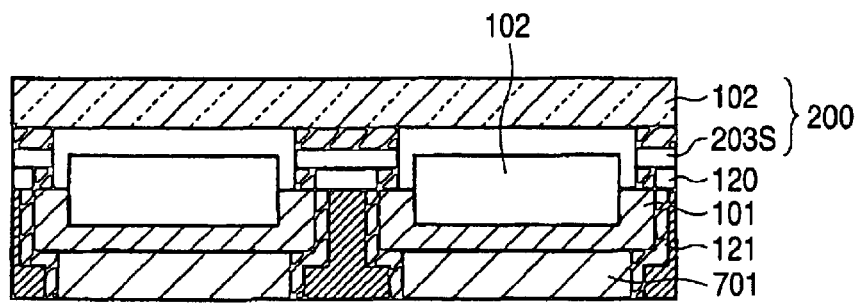
FIGS. 7(a) and (b) are views showing steps of manufacturing the solid-state imaging device of a fourth embodiment of the present invention.
Figure 7:
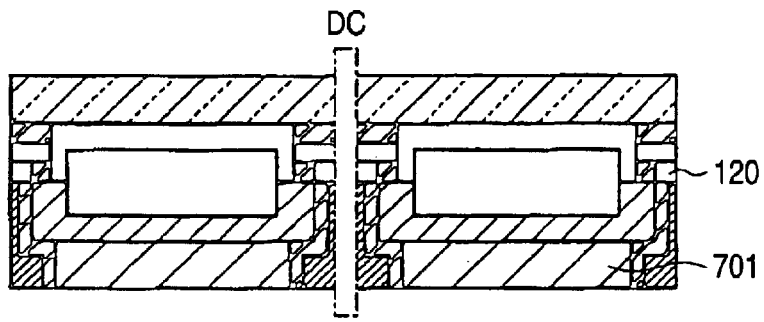

In the above third embodiment, the contacts are formed to pass through the reinforcing plate 701, the solid-state imaging device substrate, and the circuit board, and then the electrode leading to the circuit substrate side is executed so as to form the external contact terminals. In contrast, as shown in FIGS. 7(*a*) and 7(*b*), the third embodiment is characterized in that a conductive layer 120 as the wiring layer is formed on side walls and then the electrode leading is executed from the side walls of the solid-state imaging device. Pad 210 is for the external connection use.

The manufacturing steps may be carried out substantially similarly to the above second embodiment. In this case, the solid-state imaging devices in which the wiring layer is formed easily on the side wall can be formed by forming the through-holes at positions, which correspond to edge portions of respective solid-state imaging devices, and then applying the dicing along the cutting lines DC including the through-holes.

Also, since the conductive layer 120 that is filled into the through-holes is made of the light shielding material such as tungsten, or the like, the light incident onto the solid-state imaging device can be shielded and thus reduction in the malfunction can be achieved.

Also, if this reinforcing plate is formed of the polyimide resin, the ceramic, the crystallized glass, the silicon substrate whose front and back surfaces are oxidized, or the like, such reinforcing plate can fulfill a role of the thermally insulating substrate. In addition, the reinforcing plate may be formed of the sealing material with the moisture proof property, the light shielding material.

(Fifth Embodiment)

Next, a fifth embodiment of the present invention will be explained hereunder.

Figure 8:
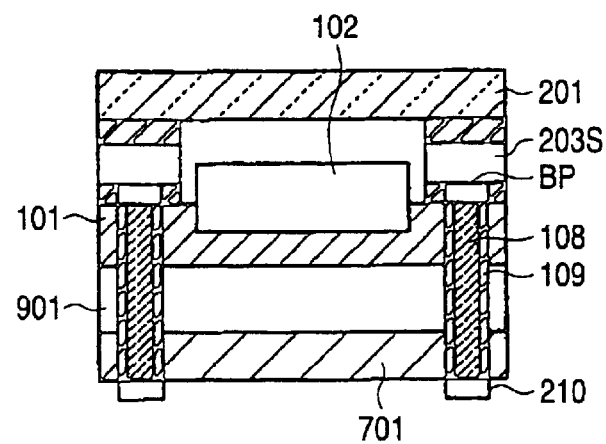
FIG. 8 is a view showing steps of manufacturing the solid-state imaging device of a fifth embodiment of the present invention.

From the second to the fourth embodiments, the back surface side of the solid-state imaging device substrate 100 is stacked on the peripheral circuit board via the reinforcing plate. In the fourth embodiment, as shown in FIG. 8, the solid-state imaging device substrate 100 is stacked on the peripheral circuit substrate 901, and the reinforcing plate 701 is stacked in turn on the back surface side of the peripheral circuit substrate.

This reinforcing plate 701 is also used as a heat radiation plate.

The manufacturing steps are executed substantially similarly to the second and third embodiments. In this case, since the solid-state imaging device substrate 100 and the peripheral circuit substrate 901 are arranged at positions that are close to each other, a connection resistance can be reduced and thus a high-speed driving can be implemented.

(Sixth Embodiment)

Next, a sixth embodiment of the present invention will be explained hereunder.

Figure 9:
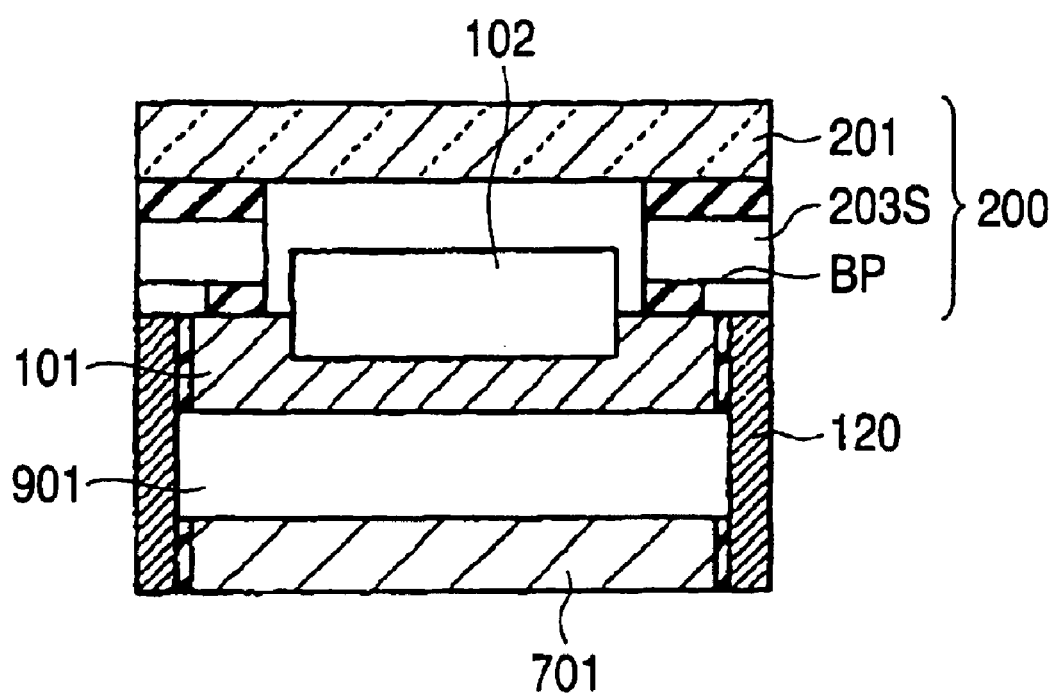
FIG. 9 is a view showing steps of manufacturing the solid-state imaging device of a sixth embodiment of the present invention.

In the sixth embodiment, the through-holes are formed in the inside of the substrate and then the electrodes are led onto the back surface side of the peripheral circuit substrate. In contrast, as shown in FIG. 9, the fifth embodiment is characterized in that a conductor layer 120 as the wiring layer is formed on the side wall.

Like the above fourth embodiment, in manufacturing, the solid-state imaging device to which side wall wirings are applied can be formed easily only by positioning the dicing lines at the positions that include the contacts formed in the through-holes.

In this solid-state imaging device, because the wirings are formed on the side walls, the signal leading electrode terminals and the current-supplying electrode terminals can also be formed on the side walls. In this case, it is needless to say that the connection may be supplied by forming the pads and the bumps on the back surface side of the peripheral circuit substrate 901. A reference 701 is the reinforcing plate.

In this case, in the above embodiments, the method of jointing the glass substrate constituting the sealing cover glass and the spacers and the method of jointing the solid-state imaging device substrate and the sealing cover glass by using the adhesive layer are explained. In all embodiments, if surfaces of the spacers and the solid-state imaging device substrate is formed of Si, the metal, or the inorganic compound, they can be jointed appropriately by the surface-activated cold joint without employment of the adhesive. If the cover glass is formed of Pyrex and the spacers are formed of silicon, the anodic joint may be employed. If the adhesive layer should be employed, not only the UV adhesive but also the thermosetting adhesive, the semi-curing adhesive, the thermosetting and UV curing adhesive, or cold-curing adhesive agent may be employed as the adhesive layer.

Also, as explained in the above first embodiment, 42 alloy, metal, glass, photosensitive polyimide, polycarbonate resin, or the like in addition to the silicon substrate may be selected appropriately as the spacers in all embodiments.

Also, when the solid-state imaging device substrate and the sealing cover glass are jointed by using the adhesive layer, flow-out of the melted adhesive layer may be prevented by forming the reservoir, or the like. Also, when the spacers and the solid-state imaging device substrate or the sealing cover glass are jointed, similarly flow-out of the melted adhesive layer may be prevented by forming a concave portion or a convex portion in the jointed portion to form the reservoir, or the like.

In this case, in the above embodiments, when the substrate on which the cutting recesses are formed is separated into individual devices, the CMP is applied up to positions of the cutting recesses. In this case, the grinding, the polishing, or the full surface etching may be employed.

Also, in the above embodiments, in the situation that the reinforcing plate (701) is employed, if such reinforcing plate is formed of the polyimide resin, the ceramic, the crystallized glass, the silicon substrate whose front and back surfaces are oxidized, or the like, as the case may be, as the material, such reinforcing plate can have a role of the thermal insulating substrate. Also, the reinforcing plate may be formed of the sealing material with the moisture proof property, the light shielding material.

Also, in the above embodiments, if the pasting between the glass substrate and the spacers is needed, such pasting may be executed by coating the ultraviolet curing resin, cold-curing adhesive agent, the thermosetting resin, or common use of them, or the semi-curing adhesive. Also, dispenser supply, screen printing, stamp transfer, or the like may be selected appropriately to form the adhesive.

In addition, examples explained in respective embodiments may be varied mutually in the scope that is applicable to overall embodiments.

As described above, according to the present invention, the solid-state imaging device the size of which is small and which is easily connected to the main body can be formed.

Also, according to the present invention, the solid-state imaging devices are positioned at the wafer level, then these imaging devices including the external leading electrode terminals are packaged collectively and integrally, and the wafer is separated every solid-state imaging device. Therefore, the solid-state imaging device that is easy to manufacture and the high-precision positioning can be achieved.

What is claimed is:

1. A solid-state imaging device comprising:
   a semiconductor substrate on which solid-state imaging elements are formed;
   a translucent member provided onto a surface of the semiconductor substrate such that spaces are provided to be opposed to light receiving areas of the solid-state imaging devices, and
   a through-hole which are formed in the semiconductor substrate, wherein
   said solid-state imaging device is electrically connected to an external contact terminal by way of said through-hole,
   wherein the translucent member is connected to the semiconductor substrate via spacers, and wherein the spacers are formed of same material as the translucent member.

2. A solid-state imaging device according to claim 1, wherein said external contact terminal is formed on a surface of the semiconductor substrate, said surface being opposed to another surface thereof where the solid-state imaging elements are formed.

3. A solid-state imaging device according to claim 1, said solid-state imaging device further comprising a reinforcing plate which is contacted at a surface side of the semiconductor substrate, said surface side being opposed to another surface of the semiconductor substrate where the solid-state imaging elements are formed, wherein
   said external contact terminal is arranged at a surface of the reinforcing plate, said surface being opposed to another surface of the reinforcing plate where contact between the semiconductor substrate and the reinforcing plate is made.

4. A solid-state imaging device comprising:
   a semiconductor substrate on which solid-state imaging elements are formed;
   a translucent member provided onto a surface of the semiconductor substrate such that spaces are provided to be opposed to light receiving areas of the solid-state imaging devices, and
   a through-hole which are formed in the semiconductor substrate, wherein
   said solid-state imaging device is electrically connected to an external contact terminal by way of said through-hole,
   wherein the translucent member is connected to the semiconductor substrate via spacers, and wherein the spacers are formed of same material as the semiconductor substrate.

5. A solid-state imaging device comprising:
   a semiconductor substrate on which solid-state imaging elements are formed;
   a translucent member provided onto a surface of the semiconductor substrate such that spaces are provided to be opposed to light receiving areas of the solid-state imaging devices, and
   a through-hole which are formed in the semiconductor substrate, wherein
   said solid-state imaging device is electrically connected to an external contact terminal by way of said through-hole,
   wherein the translucent member is connected to the semiconductor substrate via spacers, and wherein the spacers are formed of silicon.

6. A solid-state imaging device comprising:
   a semiconductor substrate on which solid-state imaging elements are formed;
   a translucent member provided onto a surface of the semiconductor substrate such that spaces are provided to be opposed to light receiving areas of the solid-state imaging devices, and
   a through-hole which are formed in the semiconductor substrate, wherein
   said solid-state imaging device is electrically connected to an external contact terminal by way of said through-hole,
   wherein the translucent member is connected to the semiconductor substrate via spacers, and wherein the spacers are formed of 42 alloy.

7. A solid-state imaging device according to claim 1, wherein said through-hole is filled with a conductive material in an inner wall thereof with an insulating film being formed in-between.

8. A solid-state imaging device according to claim 7, said insulating film is made of silicon oxide.

9. A solid-state imaging device according to claim 7 or 8, thickness of said insulating film is no less than 0.5 $\mu$m.

* * * * *